United States Patent [19]

Yabuki et al.

[11] Patent Number: 5,563,017
[45] Date of Patent: Oct. 8, 1996

[54] IMAGE-FORMING METHOD USING A LIGHT-SENSITIVE MATERIAL CONTAINING SILVER HALIDE, REDUCING AGENT, POLYMERIZABLE COMPOUND AND POLYMERIZATION INHIBITOR RELEASING COMPOUND

[75] Inventors: Yoshiharu Yabuki; Makoto Yamada, both of Kanagawa, Japan

[73] Assignee: Fuji Photo Film Co., Ltd., Kanagawa, Japan

[21] Appl. No.: 180,787

[22] Filed: Jan. 10, 1994

Related U.S. Application Data

[63] Continuation of Ser. No. 824,570, Jan. 23, 1992, abandoned.

[30] Foreign Application Priority Data

Jan. 23, 1991 [JP] Japan ..................... 3-021411

[51] Int. Cl.$^6$ ..................... G03C 1/73
[52] U.S. Cl. ............. 430/138; 430/203; 430/216; 430/254; 430/281.1; 430/330; 430/353; 430/955; 430/964
[58] Field of Search ............. 430/138, 617, 430/216, 281, 955, 338, 203, 917, 330, 336, 337, 964, 255, 254, 353

[56] References Cited

U.S. PATENT DOCUMENTS

| | | | |
|---|---|---|---|
| 4,168,982 | 9/1979 | Pazos | 430/917 |
| 4,842,977 | 6/1989 | Kakimi | 430/138 |
| 4,963,460 | 10/1990 | Oka | 430/138 |
| 5,166,040 | 11/1992 | Takeda | 430/281 |
| 5,230,981 | 7/1993 | Saito et al. | 430/138 |

FOREIGN PATENT DOCUMENTS

| | | |
|---|---|---|
| 0202490 | 11/1986 | European Pat. Off. |
| 0334386 | 9/1989 | European Pat. Off. |
| 4006991 | 9/1990 | Germany |

OTHER PUBLICATIONS

Patent Abstracts of Japan, vol. 10, No. 48 (p. 431) Feb. 25, 1986 of JP 60–192939.

*Primary Examiner*—Janis L. Dote
*Attorney, Agent, or Firm*—Sughrue, Mion, Zinn, Macpeak & Seas

[57] ABSTRACT

Image forming method is disclosed using a light-sensitive material which comprises a support and a light-sensitive layer provided thereon. The light-sensitive layer contains silver halide, a reducing agent and an ethylenically unsaturated polymerizable compound. The light-sensitive material of the present invention further contains a polymerization inhibitor releasing (PIR) compound. The polymerization inhibitor releasing compound has a function of releasing a polymerization inhibitor when the compound is heated or reacted with a base. The silver halide, the reducing agent, the polymerizable compound and the polymerization inhibitor releasing compound are preferably contained in microcapsules which are dispersed in the light-sensitive layer.

9 Claims, No Drawings

IMAGE-FORMING METHOD USING A LIGHT-SENSITIVE MATERIAL CONTAINING SILVER HALIDE, REDUCING AGENT, POLYMERIZABLE COMPOUND AND POLYMERIZATION INHIBITOR RELEASING COMPOUND

This is a continuation of application Ser. No. 07/824,570 filed Jan. 23, 1992 now abandoned.

FIELD OF THE INVENTION

The present invention relates to a light-sensitive material which comprises a support and a light-sensitive layer provided thereon containing silver halide, a reducing agent and a polymerizable compound.

BACKGROUND OF THE INVENTION

A light-sensitive material comprises a support and a light-sensitive layer provided thereon containing silver halide, a reducing agent and a polymerizable compound. The light-sensitive material is used for a method in which a polymerizable compound is polymerized by a reducing agent to form a polymer image.

An embodiment of the image forming method using a wet development process is disclosed in U.S. Pat. No. 3,387,667 (corresponding to Japanese Patent Publication No. 45(1970)-11149) and U.S. Pat. No. 3,687,667 (Japanese Patent Publication No. 47(1972)-20741).

An improved embodiment using a dry development process is proposed in U.S. Pat. No. 4,629,676 (European Patent Publication No. 0174634A2 and Japanese Patent Provisional Publications No. 61(1986)-69062 and No. 61(1986)-73145). This embodiment comprises the steps of: imagewise exposing to light a light-sensitive material comprising a support and a light-sensitive layer provided thereon which contains silver halide, a reducing agent, a polymerizable compound; and heating the light-sensitive material. A latent image of the silver halide is formed by the exposure and the polymerizable compound is polymerized by heating within the area where the latent image has been formed.

Another embodiment is also disclosed in Japanese Patent Provisional Publications No. 61(1986)-260241, No. 2(1990)-141756, No. 2(1990)-141757, No. 2(1990)-207254 and No. 2(1990)-262662. The contents of the former two publications are described in European Patent Provisional Publication No. 0202490A. In this embodiment, a polymerization inhibitor is formed from an oxidation product of a reducing agent within the area where the latent image of the silver halide has been formed. The light-sensitive material used for this embodiment further contains a thermal polymerization initiator or a photopolymerization initiator. The polymerizable compound is polymerized by the thermal polymerization initiator or the photopolymerization initiator within the area where the latent image of the silver halide has not been formed.

A preferable embodiment of the above-described light-sensitive material and the image forming method using the material are proposed in Japanese Patent Provisional Publications No. 61(1986)-27542 and No. 61(1986)-278849. In the light-sensitive material, at least the polymerizable compound and the color image forming substance of the components are contained together with in the same microcapsules. The light-sensitive material having microcapsules containing the components gives an image of high quality.

An improvement of the light-sensitive material used in the above-mentioned image forming method has recently been proposed. U.S. Pat. No. 4,983,489 and Japanese Patent Provisional Publications No. 62(1987)-264041 and No. 2(1990)-262661 disclose a light-sensitive material containing a development inhibitor releasing (DIR) compound. An example of the DIR compound is an acid precursor which reacts with a base or neutralizes a base to reduce the base concentration in the light-sensitive layer and to terminate the excess development reaction. Another example is a compound which interacts with silver and a silver halide to inhibit the excess development reaction after a proper development is achieved. The light-sensitive material containing the DIR compound is improved in the stability of the image quality against the variation of the development conditions, such as the temperature and the development time.

The concept of the DIR (development inhibitor releasing) compound itself has been well known in the conventional photography. A DIR coupler or a DIR compound has frequently been used in a conventional silver halide photographic material.

SUMMARY OF THE INVENTION

The present inventors studied the light-sensitive material containing the DIR compound, and noted some problems. The effect of the DIR compound (the improvement of the stability of an image quality) is still unsatisfactory. An excess development reaction sometimes proceeds depending upon the variation of the development conditions such as the temperature and the development time. In such cases, the contrast of the obtained image is insufficient.

Further, the DIR compound is merely effective in forming an image of hard gradation. It is technically difficult to adjust quantitatively the function of the DIR compound. Accordingly, it is not appropriate to use the DIR compound for forming an image of soft gradation, which requires a delicate adjustment.

An object of the present invention is to provide a light-sensitive material which forms an image having a high contrast improved in the stability of an image quality against the variation of the development conditions.

Another object of the invention is to provide a light-sensitive material which forms a clear image of soft gradation.

Now, the present inventors reach a quite new concept that is a polymerization inhibitor releasing compound (which is hereinafter sometimes referred to as "PIR compound").

There is provided by the present invention a light-sensitive material which comprises a support and a light-sensitive layer provided thereon, said light-sensitive layer containing silver halide, a reducing agent and an ethylenically unsaturated polymerizable compound, wherein the light-sensitive material further contains a polymerization inhibitor releasing compound which has a function of releasing a polymerization inhibitor when the compound is heated or reacted with a base.

The silver halide, the reducing agent, the polymerizable compound and the polymerization inhibitor releasing compound are preferably contained in microcapsules which are dispersed in the light-sensitive layer.

The present inventors surprisingly found that the polymerization inhibitor releasing (PIR) compound is more effective than the known development inhibitor releasing (DIR) compound. Accordingly, the light-sensitive material of the present invention forms an image having a high contrast improved in the stability of an image quality against the variation of the development conditions.

Further, it is possible to adjust quantitatively the function of the PIR compound Accordingly, the light-sensitive material of the invention can form a clear image of soft gradation.

DETAILED DESCRIPTION OF THE INVENTION

The light-sensitive material of the present invention is characterized in the polymerization inhibitor releasing compound.

The silver halide, the reducing agent, the polymerizable compound and the PIR compound are contained in the light-sensitive layer. The light-sensitive layer may comprise two or more layers, for example a silver halide layer containing the silver halide and a polymerizable layer containing the polymerizable compound.

The components of the light-sensitive layer are preferably contained in microcapsules which are dispersed in the light-sensitive layer. When the PIR compound releases a polymerization inhibitor when the compound is reacted with a base, the light-sensitive material preferably further contains a base or base precursor. The base precursor is preferred to the base. The base precursor is preferably contained in the microcapsules. The base is preferably arranged outside the microcapsules.

The PIR compound uniformly releases a polymerization inhibitor in development process. The term of the "uniformly" means that the inhibitor is released all over the light-sensitive layer independent of image (whether the latent image of silver halide is formed or not).

Examples of the polymerization inhibitor to be released by the PIR compound are described in "Polymer Handbook" (J. Brandrup and E. H. Immergut) 2nd ed. pp. II-53–54. According to the reaction mechanism, the polymerization inhibitor can be classified into the three groups (1), (2) and (3).

(1) Deactivation of an active radical (polymerization initiator) by a hydrogen abstraction reaction (e.g., phenols and hydroquinones)

(2) Deactivation of an active radical by an addition reaction (e.g., quinones)

(3) Deactivation of an active radical by coupling with a stable radical (e.g., oxygen and 1,1-diphenyl-2-picrylhydrazyl)

To construct a PIR compound, the active side of the polymerization inhibitor is blocked by designing the molecule of the inhibitor. In view of the molecular design, the inhibitors of (1) and (2) are suitable for constructing the polymerization inhibitor releasing compound used in the present invention. Namely, the PIR compound is easily prepared from the inhibitor of (1) or (2). The inhibitor of (1) can be converted into a PIR compound by substituting the hydrogen to be abstracted with a protective group. The inhibitor of (2) can also be converted into a PIR compound by chemically modifying the unsaturated bond to which a radical is added. Various chemical modifications can be used. The chemical modification is described in J. F. W. McOmie, "Protective Groups in Organic Chemistry", PLENUM PRESS; and Georg Thieme Verlag, "Methoden der Organischen Chemie (Houben-Weyl)", 6/1c, 6/1d, 7/3a, 7/3b.

The PIR compound has a function of releasing a polymerization inhibitor when the compound is heated or reacted with a base. In other words, the compound requires a heat (a heated condition) or a base (a basic condition) for releasing leasing a polymerization inhibitor. The compound may require both of the heat and the base.

In the case that the PIR compound releases a polymerization inhibitor when the compound is heated, the PIR compound is preferably heated by a heat development process. Accordingly, the heating temperature is preferably the same as the temperature of the heat development. The heating temperature is preferably in the range of 60° C. to 260° C., and more preferably in the range of 80° C. to 180° C. The heating time is preferably in the range of 0.1 to 5 seconds.

In the case that the PIR compound releases a polymerization inhibitor when the compound is reacted with a base, an intermediate may intervene between the PIR compound and the base. For example, another component of the light-sensitive layer is reacted with a base to form a nucleophilic compound, and the PIR compound is reacted with the nucleophilic compound to release a polymerization inhibitor. The reaction containing an intermediate is also included in the expression "when the compound reacted with a base" in the present invention.

The PIR compound is preferably represented by the following formulas (I)–(V).

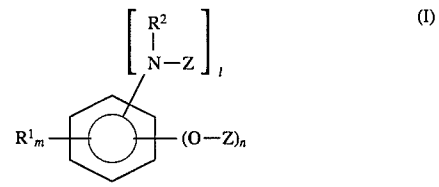

In the formula (I), Z is a group having a property of reacting with a base or a nucleophilic compound to break the bond of O—Z or N—Z. Examples of Z include an acyl group, carbamoyl, β-sulfonylmethyl group, β-sulfonylethyl group, β-cyanoethyl group, an alkoxycarbonyl group, a sulfonyl group, hydroxymethyl.

$R^1$ is hydrogen, an alkyl group, a cycloalkyl group, an aryl group, an aralkyl group, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an acylamino group, a sulfonylamino group, cyano, nitro, an alkylthio group, an arylthio group, a mercapto group, a sulfonyl group, sulfo, sulfamoyl or a halogen atom.

The alkyl group, the aryl group and the amino represented by $R^1$ may have one or more substituent groups. Examples of the substituent groups include an alkyl group, an aryl group, a halogen atom, an alkoxy group, an aryloxy group, an acyl group, hydroxyl and cyano. $R^2$ is an alkyl, cycloalkyl, aralkyl, aryl, acyl or hydrogen.

In the formula (I), "m" is an integer of 0 to 5. When "m" is 2 or more, the groups represented by $R^1$ may be combined with each other to form a ring. Each of "l" and "n" independently is an integer of 0 to 4, and the sum of "l" and "n" is 1 or more.

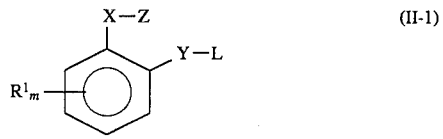

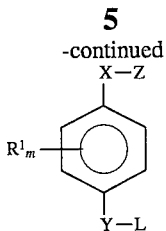 (II-2)

In the formulas (II-1) and (II-2), Z is a group having a property of reacting with a base or a nucleophilic compound to break the bond of X—Z. Examples of Z are the same as those shown in the formula (I).

Each of X and Y independently is oxygen, sulfur or —CR$^6$R$^7$— wherein each of R$^6$ and R$^7$ independently is hydrogen, an alkyl group or an aryl group.

L is an elimination group. Examples of L include a halogen atom, a sulfonyl group, a sulfonyloxy group, an alkoxy group, an aryloxy group, an arylthio group, an alkylthio group, an acylamino group, an acyloxy group and a sulfonylamino group.

R$^1$ is hydrogen, an alkyl group, a cycloalkyl group, an aryl group, an aralkyl group, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an acylamino group, a sulfonylamino group, cyano, nitro, an alkylthio group, an arylthio group, a mercapto group, a sulfonyl group, sulfo, sulfamoyl or a halogen atom.

The alkyl group, the aryl group, and the amino group represented by R$^1$ have one or more substituent groups. The alkyl group and the aryl group represent by R$^6$ and R$^7$ have one or more substituent groups. Examples of the substituent groups are the same as those shown in the formula (I).

In the formulas (II-1) and (II-2), "m" is an integer of 0 to 4. When "m" is 2 or more, the groups represented by R$^1$ may be combined with each other to form a ring.

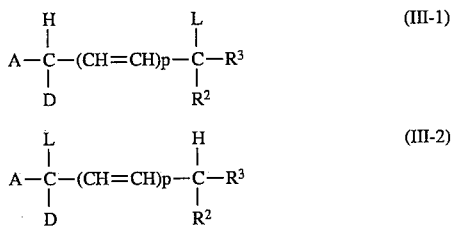

In the formulas (III-1) and (III-2), L is an elimination group. Examples of L are the same as those shown in the formulas (II-1) and (II-2).

A is an electron attractive group. Examples of A include cyano, nitro, a sulfonyl group, carbamoyl, sulfamoyl, an alkoxycarbonyl group, an aryloxycarbonyl group, a heterocyclic group and a halogen atom.

D is hydrogen, an alkoxy group, an aryloxy group, an alkyl group, an aryl group, an aralkyl group, a cycloalkyl group, an alkylthio group, an arylthio group, an acylamino group, amino or a halogen atom.

Each of R$^2$ and R$^3$ independently is an alkyl group, a cycloalkyl group, an aralkyl group, an aryl group, an acyl group or hydrogen.

The alkyl group, the aryl group and the amino group represented by D may have one or more substituent groups. The alkyl group and the aryl group represented by R$^2$ and R$^3$ may have one or more substituent groups. Examples of the substituent groups are the same as those shown in the formula (I).

In the formulas (III-1) and (III-2), "p" is an integer of 0 to 3.

The groups represented by A, D, R$^2$ and R$^3$ may be combined with each other to form a ring.

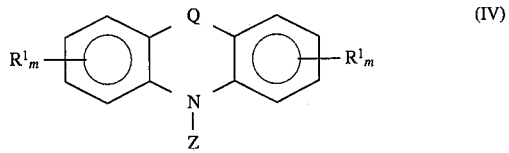 (IV)

In the formula (IV), R$^1$ is hydrogen, an alkyl group, a cycloalkyl group, an aryl group, an aralkyl group, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an acylamino group, a sulfonylamino group, cyano, nitro, an alkylthio group, an arylthio group, a mercapto group, a sulfonyl group, sulfo, sulfamoyl or a halogen atom.

Q is oxygen, sulfur or —CR$^6$R$^7$— wherein each of R$^6$ and R$^7$ independently is hydrogen, an alkyl group or an aryl group.

The alkyl group, the aryl group and the amino represented by R$^1$, may have one or more substituent groups. The alkyl group and the aryl group represented by R$^6$ and R$^7$ may have one or more substituent groups. Examples of the substituent groups are the same as those shown in the formula (I).

In the formula (IV), "m" is an integer of 0 to 4. When "m" is 2 or more, the groups represented by R$^1$ may be combined with each other to form a ring; Z has the same definition as Z in formula (I) defined above.

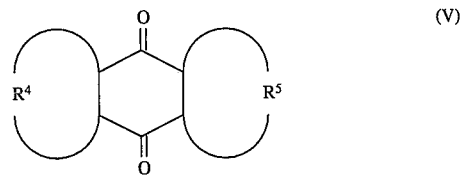 (V)

In the formula (V), each of R$^4$ and R$^5$ independently is an alkylene group or another divalent group which forms 5- or 6-membered ring. At least one of R$^4$ and R$^5$ is an alkylene group. A benzene ring may be condensed with the 5- or 6-membered ring formed by R$^4$ or R$^5$.

Examples of the PIR compound are shown below.

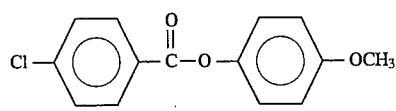 (1)

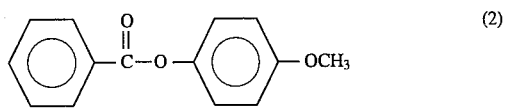 (2)

-continued
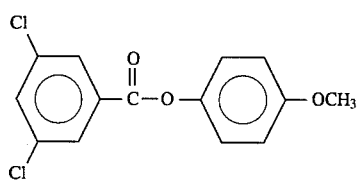 (3)
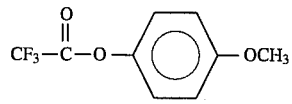 (4)
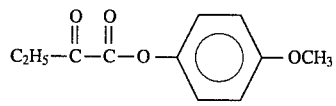 (5)
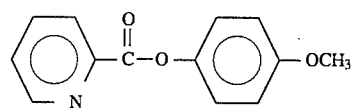 (6)
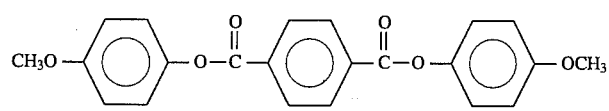 (7)
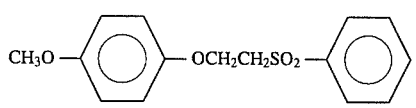 (8)
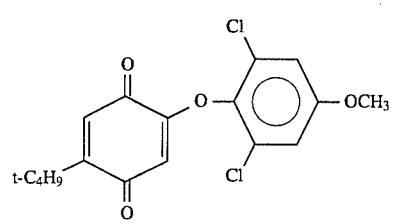 (9)
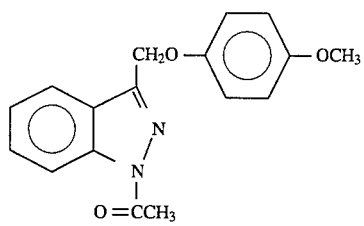 (10)
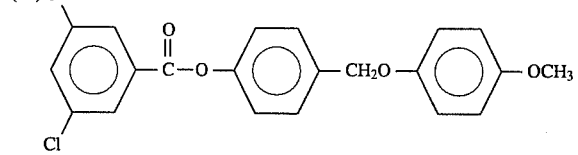 (11)
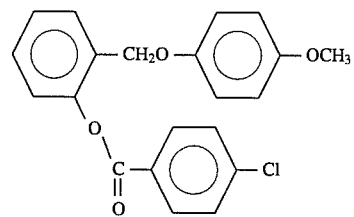 (12)
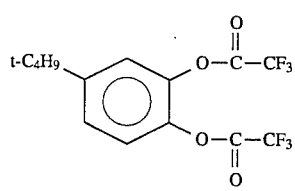 (13)
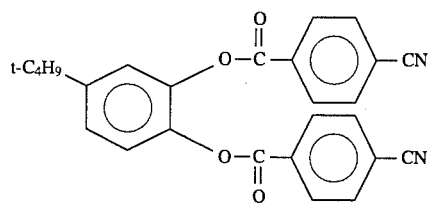 (14)
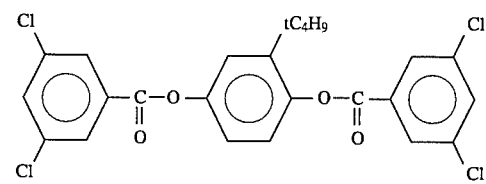 (15)
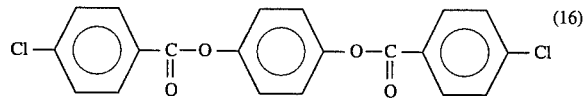 (16)
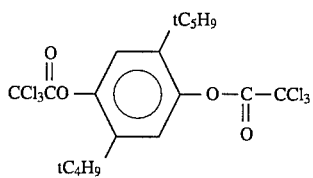 (17)
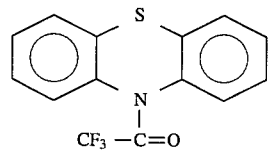 (18)
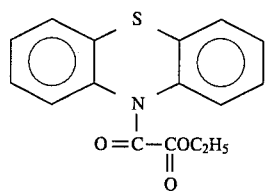 (19)

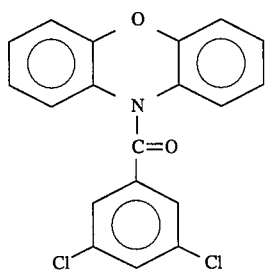 (20)
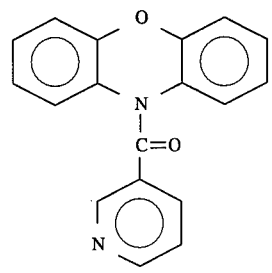 (21)
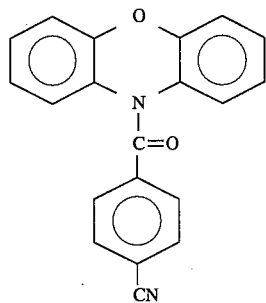 (22)
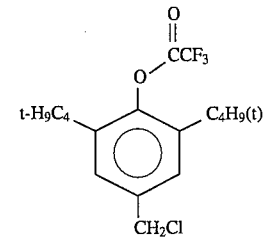 (23)
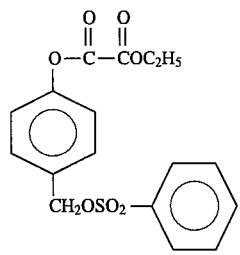 (24)
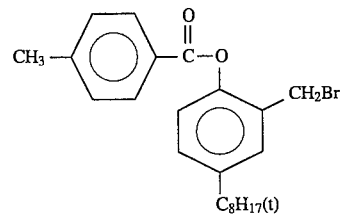 (25)
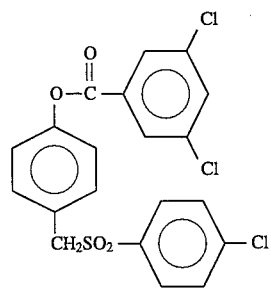 (26)
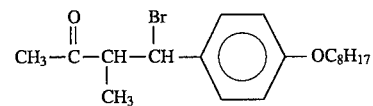 (27)
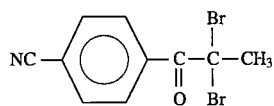 (28)
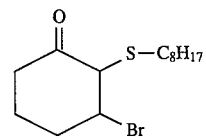 (29)
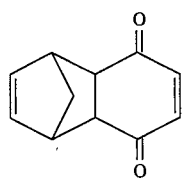 (30)
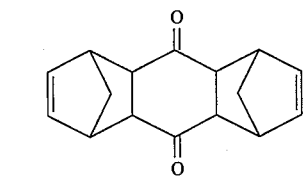 (31)
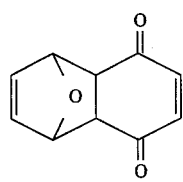 (32)
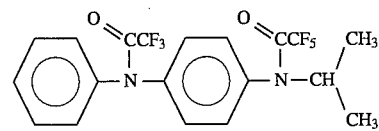 (33)
These PIR compounds can be easily synthesized by the known methods, for example acylation of the corresponding phenols or anilines, alkylation of the corresponding halides or Diels-Alder reaction of the corresponding quinones.

Synthesis of the compound (3)

Into 150 ml of methylene chloride were dissolved 24.8 g of methoxyphenol and 31 ml of triethylamine. To the resulting solution, 41.8 g of 3,5-dichlorobenzoyl chloride was dropwise added at a temperature of not more than 15° C. Triethylamine-hydrochloric acid salt precipitated was filtered off and the filtrate was condensed to obtain a solid. Methanol was added to the solid and the resulting mixture was filtered to obtain crude crystals. The crude crystals were dissolved into ethanol. Recrystallization was carried out to prepare 53.9 g of 4'-methoxyphenyl-3,5-dichlorobenzoate. The yield was 90.7%. The melting point was 99°–100° C.

Synthesis of the compound (12)

To a mixture of 64.8 g of o-cresol, 87 ml of triethylamine and 800 ml of acetonitrile, 108.6 g of p-chlorobenzoyl chloride was dropwise added at the temperature of 5°–10° C. The resulting solution was stirred for 1 hour at room temperature, and then condensed. After 500 ml of water and 500 ml of ethyl acetate were added to the solution, extraction was carried out. The obtained ethyl acetate portion was condensed and 500 ml of hexane was added. Crystals precipitated was filtered off and collected. The amount and the melting point of the obtained crystals were found to be 120.3 g (Yield: 81.3%) and 68°–72° C., respectively.

A mixture of 12.3 g of 2-methylphenyl-4-chlorobenzoate (obtained above), 7.12 g of N-bromosuccinimide, 20 mg of benzoyl peracetate and 50 ml of carbon tetrachloride was stirred under radiation of a tungsten lamp of 100 w for 2 hours. After the reaction solution was filtered, the filtrate was condensed and 20 ml of acetone was added. The resulting solution was added dropwise to a suspension of 4.5 g of p-methoxyphenol, 4.9 g of potassium carbonate and 50 ml of acetone under reflux.

After refluxing for 5 hours, 100 ml of 1N hydrochloric acid and 100 ml of ethyl acetate were added and then extraction was carried out. The obtained ethyl acetate portion was condensed and purified by silica-gel column chromatography to prepare 4.8 g of the compound (12).

The amount of the PIR compound of the invention to be added can be varied in a wide range, but generally it is in the range of 0.001–50 wt. % and preferably 0.01–10 wt. % based on the amount of the polymerizable compound. Further, two or more PIR compounds of the invention can be also used in combination.

A silver halide, a color image forming substance (optionally used), a polymerizable compound, a reducing agent, and a base and/or a base precursor, which are components of the light-sensitive material of the invention, are described below in detail.

Examples of the silver halide used in the light-sensitive material of the invention include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron, dodecahedron or tetradecahedron, an irregular form such as spherical form or tubular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion described in U.S. Pat. Nos. 3,574,628 and 3,655,394, and U.K. Patent No. 1,413,748.

A tubular grain having an aspect ratio of not less than approx. 5 can be also employed. The tubular silver halide grains can be easily prepared by processes described in Gutoff, "Photographic Science and Engineering, Vol. 14, pp. 248–257 (1970)", U.S. Pat Nos. 4,434,226, 4,414,310, 4,433,048 and 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22–23 (Dec. 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
|---|---|---|
| Chemical sensitizing agent | p. 23 | p. 648 (right side) |
| Sensitivity-increasing agent | | p. 648 (right side) |
| Spectral sensitizing agent and Supersensitizing agent | p. 23–24 | p. 648 (right side)–p. 649 (right side) |
| Anti-fogging agent and Stabilizer | p. 24–25 | p. 649 (right side)- |

It is preferred to use silver halide grains having a relatively low fogging value.

For uniformly incorporating the silver halide into microcapsules, a copolymer composed of a hydrophilic repeating unit and a hydrophobic repeating unit is preferably dissolved in the polymerizable compound.

There is no specific limitation with respect to the color image forming substance, and various kinds of substances are available. Examples of the color image forming substance include colored substance (i.e., dyes and pigments) and non-colored or almost non-colored substance (i.e., color former or dye- or pigment-precursor) which develops to give a color by an external energy (e.g., heating, pressing or light irradiation) or by other components (i.e., color developer).

In the present invention, the color image forming substance preferably is a colored substance such as a dye or a pigment.

As the dye or pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquinone pigment, perylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluorescent pigment and inorganic pigment.

The pigment particles used for the invention may have non-treated surface and may be surface treated. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC Shuppan (ed. 1984); and "New Application and Technique of Pigment", CMC Shuppan (ed. 1986).

The diameter of the pigment particles preferably is in the range of 0.01 to 10 μm, more preferably 0.05 to 1 μm in the measurement after the particles are dispersed in the polymerizable compound.

The pigment is preferably used in an amount of 5 to 60 parts by weight, based on 100 parts by weight of the polymerizable compound.

The pigment particles can be dispersed in the same manner as in a known dispersing technique such as preparation of ink or toner.

Various dispersing devices are available. Examples of the dispersing device include a sand mill, an attritor, a pearl mill, a supermill, a ball mill, an impeller, a disperset, a KD mill, a colloid mill, a dynatron, a three-rolls mill and a pressure kneader. The dispersing devices are described in "New Application and Technique of Pigment", CMC Shuppan (ed. 1986).

The polymerizable compounds used in the light-sensitive material generally are compounds having an ethylenically unsaturated group.

Examples of the compounds having an ethylenic unsaturated group which can be used for the light-sensitive material include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Concrete examples of the acrylic esters, which are preferably used, include n-butyl acrylate, cyclohexyl acrylate, 2-ethylhexyl acrylate, benzyl acrylate, furfuryl acrylate, ethoxyethoxyethyl acrylate, tricyclodecanyloxyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3-dioxane triacrylate, triacrylate of propyleneoxide addition product of trimethylolpropane, polyacrylate of hydroxypolyether, hexaacrylate of carprolactone addition product of dipentaerythritol, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compounds can be used singly or in combination of two or more compounds. Further, polymerizable compounds in which a polymerizable functional group such as a vinyl group or a vinylidene group is introduced into a chemical structure of the below-described reducing agent can be also employed as the polymerizable compound.

Examples of the reducing agents employable for the invention include hydrazines, hydroquinones, catechols, p-aminophenols, p-phenylenediamines, 3-pyrazolidones, 3-aminopyrazoles, 4-amino-5-pyrazolones, 5-aminouracils, 4,5-dihydroxy- 6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, α-sulfonamidoketones and methylenebisphenols.

These reducing agents are also described in T. James, "The Theory of the Photographic Process", 4th edition, pp. 291–334 (1977), Research Disclosure Vol. 170, No. 17029, pp. 9–15 (June 1978), and Research Disclosure Vol. 176, No. 17643, pp. 22–31 (December 1978). Further, there can be also employed a reducing agent precursor capable of releasing a reducing agent under heating or in contact with a base, as described in Japanese Patent Provisional Publication No. 62(1987)-210446.

These reducing agents are also described in T. James, "The Theory of the Photographic Process", 4th edition, pp. 291–334 (1977), Research Disclosure Vol. 170, No. 17029, pp. 9–15 (June 1978), and Research Disclosure Vol. 176, No. 17643, pp. 22–31 (December 1978). Further, there can be also employed a reducing agent precursor capable of releasing a reducing agent under heating or in contact with a base, as described in Japanese Patent Provisional Publication No. 62(1987)-210446. Also in the light-sensitive material of the invention, various reducing agents and reducing agent precursors described in the above publications, applications and literatures can be effectively employed.

Among the above-mentioned reducing agents, those having a basic nature, which form a salt with an acid, can be used in the form of a salt with an appropriate acid.

In the case where two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces the polymerization of the polymerizable compound by oxidation-reduction reaction with other reducing agent. Both interactions may occur simultaneously. Thus, it is difficult to determine which of the interactions has occurred in practical use.

The reducing agent can be used in the light-sensitive material in an amount of wide range, but generally the amount thereof is in the range of 0.1 to 1,500 mole %, preferably in the range of 10 to 300 mole %, based on the amount of the silver salt.

The development and polymerization reactions smoothly proceed in alkaline conditions. Therefore, the light-sensitive material contains a base or a base precursor as an image formation accelerator.

In this case, a base precursor, which can release a base when it is heated, is preferably used in view of preservability.

The base precursor used in the present invention includes various inorganic or organic compounds (decarboxylation type, thermal decomposition type, reaction type and complex salt-formation type).

The base precursor employable in the invention preferably releases a base at a temperature ranging from 50° to 200° C., more preferably from 80° to 180° C.

The base precursor preferably has a solubility in water of not more than 1% at 25° C. to be incorporated into microcapsules. Followings are such preferable base precursors.

(a) A base precursor composed of a salt of an organic base with a carboxylic acid; wherein the organic base is a diacidic, triacidic or tetraacidic base which composed of two to four amidine moieties and at least one residue of a hydrocarbon or a heterocyclic ring as a linking group of the amidine moieties, and each of the amidine moieties corresponds to an atomic group formed by removing one or two hydrogen atoms from the amidine having the following formula (VI).

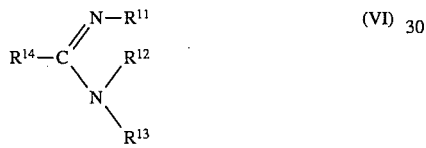
(VI)

[In the formula (VI), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{11}$, $R^{12}$, $R^{13}$ and $R^{14}$ may be combined together to form a five-membered or six-membered nitrogen-containing heterocyclic ring.]

(b) A base precursor composed of a salt of an organic base with a carboxylic acid; wherein the organic base is a diacidic, triacidic or tetraacidic base which composed of two to four guanidine moieties and at least one residue of a hydrocarbon or a heterocyclic ring as a linking group of the guanidine moieties, and each of the guanidine moieties corresponds to an atomic group formed by removing one or two hydrogen atoms from the guanidine having the following formula (VII).

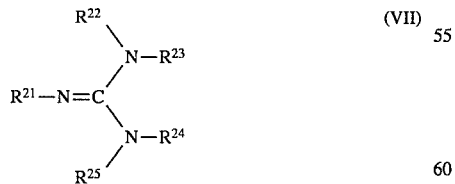
(VII)

[In the formula (II), each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{21}$, $R^{22}$, $R^{23}$, $R^{24}$ and $R^{25}$ may be combined together to form a five-membered or six-membered nitrogen-containing heterocyclic ring.]

The base precursors of (a) and (b) are described in detail in Japanese Patent Provisional Publications No. (1988)-31670 and No. 64 (1989)-68746.

Examples of the base precursors are given below, but these examples do not restrict base precursors used in the invention.

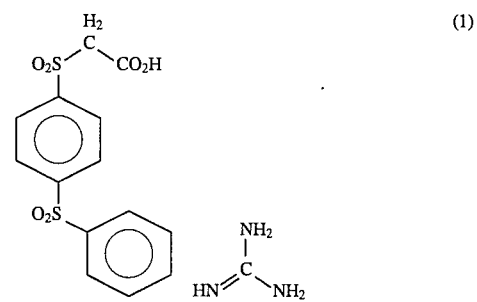
(1)

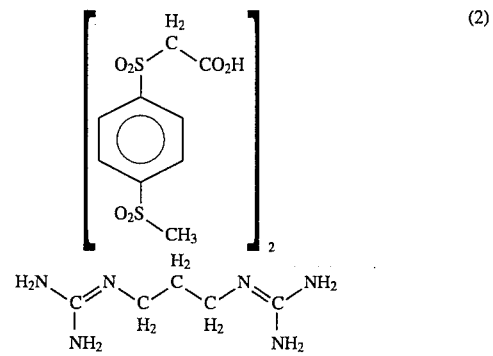
(2)

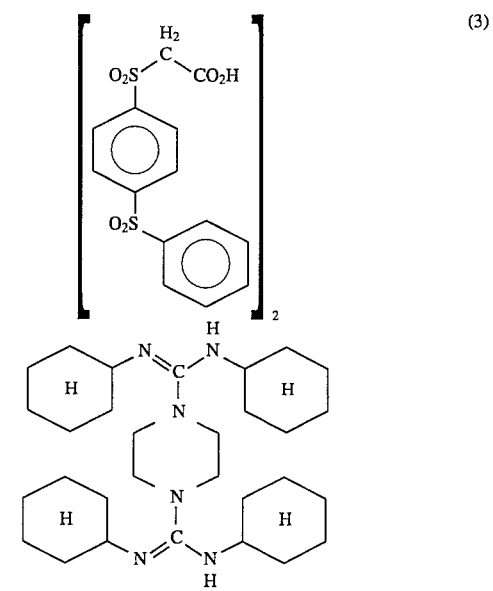
(3)

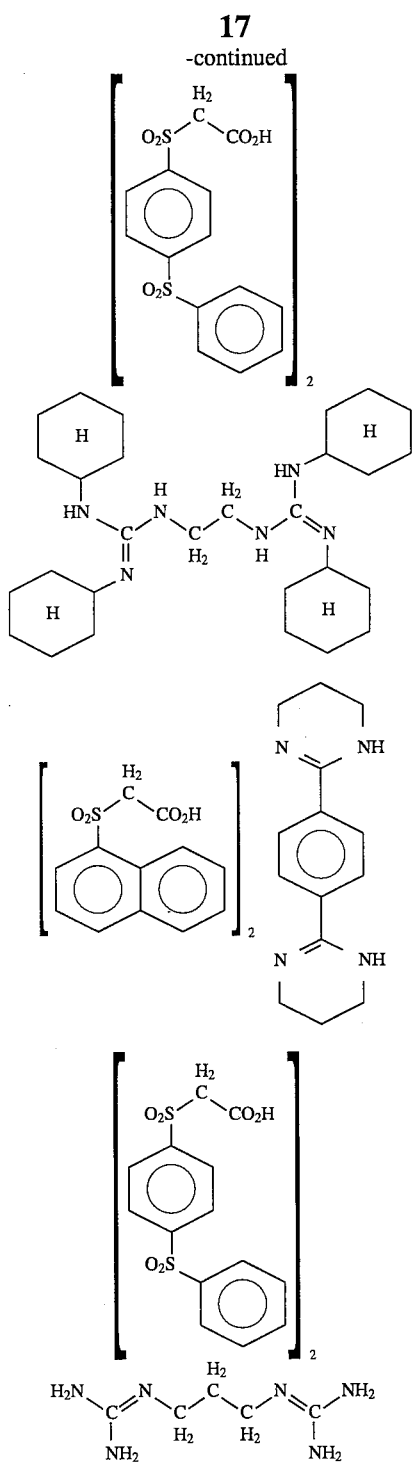
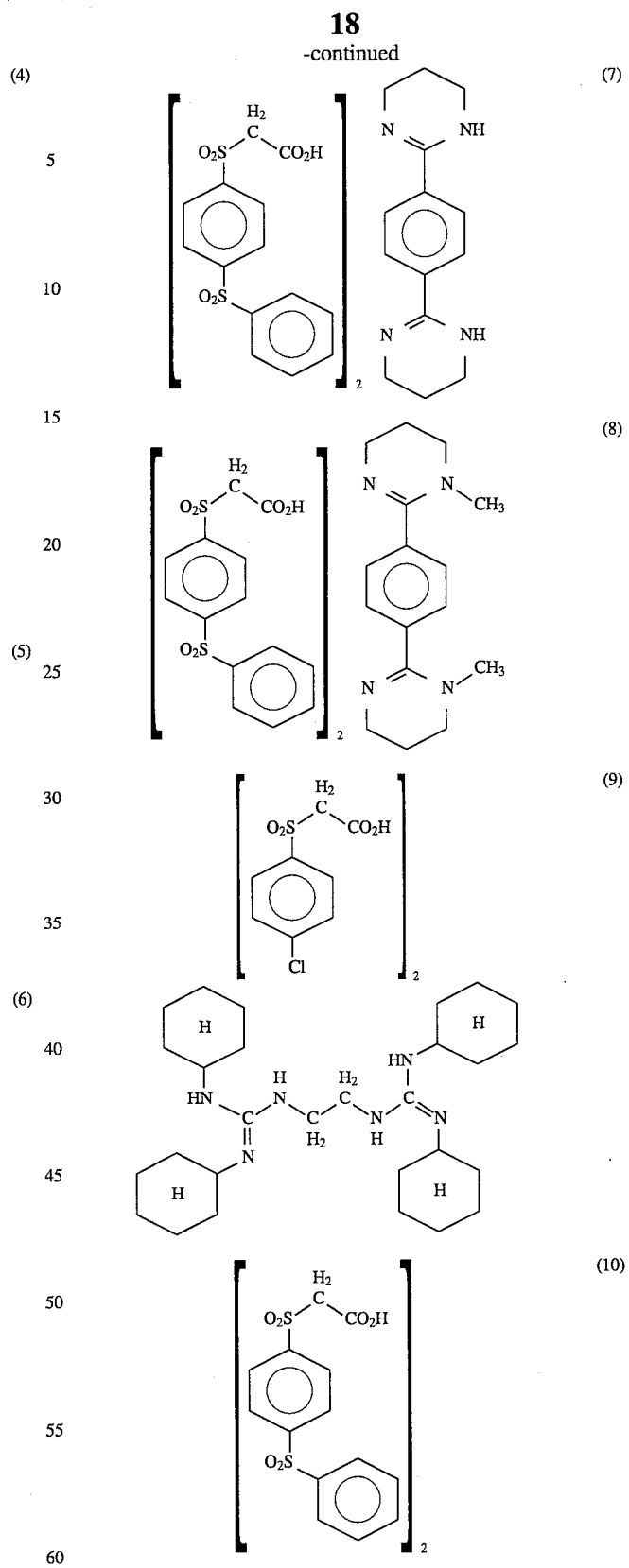

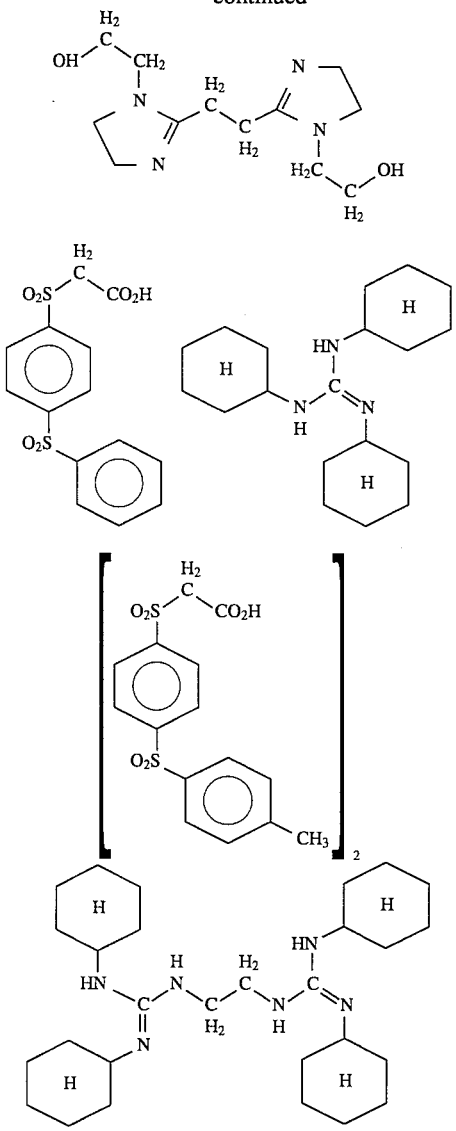

There is no specific limitation on the preparation of microcapsules, and any known processes can be employed. Examples of the processes for preparing microcapsules include a process using coacervation of hydrophilic wall-forming materials (U. S. Pat. Nos. 2,800,457 and 2,800,458); an interfacial polymerization process (U.S. Pat. No. 3,287,154, U.K. Patent No. 990,443, and Japanese Patent Publications No. 38(1963)-19574, No. 42 (1967)-446 and No. 42(1967)-771); a process using precipitation of polymers (U.S. Pat. Nos. 3,418,250 and 3,660,304); a process of using isocyanate-polyol wall-materials (U.S. Pat. No. 3,796,669); a process of using isocyanate wall-materials (U.S. Pat. No. 3,914,511); and a process of using amino-aldehyde resins (U.S. Pat. Nos. 4,001,140, 4,087,376, 4,089,802 and 4,025,455, and Japanese Patent Provisional Publications No. 62(1987)-209439, No. 64(1989)-91131 and No. 1(1989)-154140, and Japanese Patent application No. 63(1988)-241635).

Examples of the amino-aldehyde resins include a urea-formaldehyde resin, a urea-formaldehyde-resorcinol resin, a melamine-formaldehyde resin, an acetoguanamine-formaldehyde resin and a benzoguanamine-formaldehyde resin.

Further, examples of the processes for preparing microcapsules include an in situ process using polymerization of monomers (Japanese Patent Publication No. 36(1961)-9168 and Japanese Patent Provisional Publication No. 51(1976)9079); a polymerization dispersing and cooling process (U.K. Patents No. 927,807 and No. 965,074); and a spray-drying process (U.S. Pat. No. 3,111,407 and U.K. Patent No. 930,422).

A process for encapsulating oily droplets of the polymerizable compound is not limited to the above-mentioned ones, but a process of emulsifying core materials and then forming a polymeric membrane as a microcapsule shell over the core material is particularly preferred. A light-sensitive material using microcapsules having a shell of a polyamide resin and/or a polyester resin is described in Japanese Patent Provisional Publication No. 62(1987)-209437. A light-sensitive material using microcapsules having a shell of a polyurea resin and/or a polyurethane resin is described in Japanese Patent Provisional Publication No. 62(1987)-209438. A light-sensitive material using microcapsules having a gelatin shell is described in Japanese Patent Provisional Publication No. 62(1987)-209440.

A light-sensitive material using microcapsules having an epoxy resin shell is described in Japanese Patent Provisional Publication No. 62(1987)-209441. A light-sensitive material using microcapsules having a shell of a complex resin containing a polyamide resin and a polyurea resin is described in Japanese Patent Provisional Publication No. 62(1987)-209447. A light-sensitive material using microcapsules having a shell of a complex resin containing a polyurethane resin and a polyester resin is described in Japanese Patent Provisional Publication No. 62(1987)-209442.

A melamine-formaldehyde resin, of which fine microcapsules can be made, is particularly preferred in the invention.

Japanese Patent Application No. 1(1989)-37782 discloses a microcapsule provided with a polymer shell of a polymeric compound (e.g., a melamine-formaldehyde resin) around a film composed of a reaction product of a water-soluble polymer having a sulfinyl group and a polymerizable compound having an ethylenic unsaturated group. This fine microcapsule can be preferably employed in the invention.

In the case where aminoaldehyde resins are used for microcapsules, the amount of residual aldehyde is preferably regulated to be below a certain value.

A mean grain size of microcapsules is preferably within the range of 3 to 20 μm. It is preferred that the grain sizes of microcapsules be homogeneously dispersed in the range above a certain value. The ratio between the thickness and the grain size of a microcapsule is preferably within a certain range.

In the case where a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case where a silver halide is contained in microcapsules, the silver halide is preferably contained within the shell of the microcapsule. The light-sensitive material containing such a silver halide is described in Japanese Patent Provisional Publication No. 62(1987)-169147.

In preparation of the microcapsules, a solid base precursor may be directly dispersed in a polymerizable compound. However, it is particularly preferred that a base precursor be dispersed in water, and that the dispersion be then emulsified in a polymerizable compound.

In this case, a nonionic or amphoteric water soluble polymer is preferably dissolved in water in which the base precursor is dispersed.

Examples of the nonionic water soluble polymers include polyvinyl alcohol, polyvinyl pyrrolidone, polyacrylamide, polymethylvinyl ether, polyacryloylmorpholine, polyhydroxyethylacrylate, polyhydroxyethylmethacrylate-coacrylamide, hydroxyethyl cellulose, hydroxypropyl cellulose and methylcellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

When a shell of a microcapsule is formed by dispersing an oily liquid containing a silver halide, a reducing agent, a color image forming substance (optionally used) and a base precursor (or a base) to an aqueous medium in the process for preparing the light-sensitive microcapsules, a nonionic or anionic water soluble polymer is preferably contained in the aqueous medium. The amount of oily liquid is preferably within the range of 10 to 120 weight %, more preferably 20 to 90 weight %, based on the amount of the aqueous medium.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose.

Examples of the anionic water soluble polymer include polystyrenesulfinic acid, a salt of a copolymer of styrenesulfinic acid, a salt of polystyrenesulfonic acid, a copolymer of styrenesulfonic acid, a salt of polyvinyl sulfate, a salt of polyvinylsulfonic acid, a copolymer of maleic anhydride and styrene, and a copolymer of maleic anhydride and isobutylene.

The aqueous medium preferably contains the anionic water soluble polymer in an amount of 0.01 to 5 weight %, and more preferably 0.1 to 2 weight %.

It is particularly preferred to use a water soluble polymer having a few sulfinic groups together with a nonionic water soluble polymer.

A hydrophilic compound is preferably dissolved in a polymerizable compound to reduce the solubility of the base precursor in the polymerizable compound. Examples of the hydrophilic group of the compound include —OH, —SO$_2$NH$_2$, —CONH$_2$ and —NHCONH$_2$. Examples of the hydrophilic compound include polyethylene glycol, polypropylene glycol, benzoic amide, cyclohexylurea, octyl alcohol, dodecyl alcohol, stearyl alcohol and stearamide.

With respect to the support employable in the invention, materials having good heat conductivity are preferably used because the light-sensitive material is heated from the side of the support (i.e., the side on which the light-sensitive layer is not provided) in the developing stage.

Examples of the materials employable for the preparation of the support include glasses, ordinary papers, fine paper, coat paper, cast-coat paper, synthetic papers, metals and analogues thereof, films (e.g., polyester) on which metals (e.g., aluminum) are deposited, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

Among them, the support is preferably made of a polymer film. The thickness of the support is not more than 50 μm in view of the above-mentioned heat conductivity.

The image forming method of the invention comprises at least the steps of imagewise exposing, heating and pressing the material, and therefore the light-sensitive material is preferably used in the form of a continuous belt. Since the continuous belt of the material is subject to operations such as transferring, heating, pressing and rolling up, the physical strength and thermal properties to endure the operations are desired.

From the above-mentioned point of view, a polymer film is preferably used for the support in view of the physical strength (e.g., tensile strength, elasticity, rigidity), and further the film having the thickness of not more than 50 μm, which has good heat conductivity, is particularly preferable. A film having the thickness of more than 50 μm has poor heat conductivity, and therefore it is difficult to shorten the development process. A film having the thickness of not more than 10 μm is not preferable in view of the physical strength.

To provide a light-sensitive layer onto the support, it is particularly preferred that a subbing layer described in Japanese Patent Provisional Publication 61(1986)-113058 be provided or that an aluminum film be deposited onto the polymer support.

Therefore, the most preferable support used for the present invention is a polymer film of which thickness is not more than 50 μm and onto which an aluminum film is provided.

Optionally employable components used for the light-sensitive material of the invention are described below.

The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatin derivatives, cellulose derivatives, starch and gum arabic; and synthetic polymer substances such as polyvinyl alcohol, polyvinyl pyrrolidone and water-soluble polyvinyl compound (e.g., acrylamide polymer).

One of the other examples of synthetic polymer substances is a dispersing vinyl compound which increases the size-stability of photographic materials in form of latex. A light-sensitive material using a binder is described in Japanese Patent Provisional Publication No. 61(1986)-69062, and a light-sensitive material using a binder and microcapsules together with is described in Japanese Patent Provisional Publication No. 62(1987)-209525.

An organometalic salt can be used as an oxidizing agent in combination with silver halide in the invention. An organic silver salt is most preferably employed.

Examples of an organic compound employable for forming such organosilver salt oxidizing agent include benzotriazoles, aliphatic acids and other compounds described in U.S. Pat. No. 4,500,626 (columns 52–53). Also effectively employable are silver salts of carboxylic acids having alkynyl group (e.g., silver phenylpropionate) described in Japanese Patent Provisional Publication No. 60(1985)-113235 and acetylene silver salt described in Japanese Patent Provisional Publications No. 61(1986)-349044 and No. 64(1989)-57256. The organic silver salts can be used singly or in combination of two or more kinds.

The above-mentioned organic silver salt can be used with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$–10 g/m$^2$ in terms of the amount of silver metal.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,736, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 µm, more preferably 5 to 40 m, in terms of volume mean diameter. In the case where oily droplets are encapsulated, it is effective that the size of the grain is larger than that of the microcapsule.

Various image formation accelerators are employable for the light-sensitive material.

Image formation accelerators have the functions such as 1) accelerating the transfer of a base or a base precursor, 2) accelerating the reaction of a reducing agent and a silver salt, 3) accelerating the passivating reaction of coloring substances by polymerization. From a viewpoint of physical chemistry concerning the functions, the image formation accelerators can be classified into base or base precursor, nucleophilic compounds, oils, heat solvents, surface active agents, compounds having interactions with silver or silver salts, compounds having deoxidization function and other compounds. However, these substances generally have complex functions, so each of them usually has some acceleration effects, which are described in U.S. Pat. No. 4,678,739 (columns 38–40) and Japanese Patent Provisional Publication No. 62(1987)-209443 in detail.

In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", pp.6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", pp.63–147, edited by the General Technical Center (1989).

Various surface active agents are employable for the light-sensitive material for various purposes, such as aiding the coating process, increasing facility of peeling off, increasing slipperiness, preventing electrification and accelerating development. Concrete examples of the surface active agent are described in Japanese Patent Provisional Publications No. 62(1987)-173463 and No. 62(1987)-183457.

An antistatic agent is employable for the light-sensitive materials to prevent electrifying. Antistatic agents are described in Research Disclosure Vol. 176, No. 17643, pp. 27 (November 1978).

To prevent halation and irradiation, a dye or a pigment may be added to the light-sensitive layer of the light-sensitive materials. The light-sensitive material of which light-sensitive layer contains a white pigment is described in Japanese Patent Provisional Publication No. 63(1988)-29748.

The microcapsules may contain a coloring matter having a property of being decolored by heating or irradiation with light. The coloring matter having a property of being decolored by heating or irradiation with light can play the role corresponding to yellow filter in the conventional silver salt photography system. The light-sensitive material using such coloring matter having a property of being decolored by heating or irradiation with light is described in Japanese Patent Provisional Publication No. 63(1988)-974940.

In the case where a solvent of a polymerizable compound is used for the light-sensitive material, the solvent is preferably contained in microcapsules other than those containing polymerizable compound. The light-sensitive material using an organic solvent compatible with a polymerizable compound contained in microcapsules is described in Japanese Patent Provisional Publication No. 62(1987)-209524. Silver halide grains adsorbing water soluble vinyl polymer can be also employed-. Such light-sensitive material using water soluble vinyl polymer is described in Japanese Patent Provisional Publication No. 62(1987)-91652.

Other optional components which can be contained in the light-sensitive layer are described in Research Disclosure Vol. 170, No. 17029, pp. 9–15 (June, 1978) and the above-described publications.

Examples of an optional layer provided in a light-sensitive material include an image-receiving layer, a heating layer, an anti-electrifying layer, an anti-curling layer, a peeling layer, a cover sheet or a protective layer and an anti-halation layer (a coloring layer).

The light-sensitive materials having a heating layer, having a cover sheet or a protective layer and having an anti-halation layer (a coloring layer) is described in Japanese Patent Provisional Publications No. 61(1986)-94434, No. 62(1987)-210447 and No. 63(1988)-101842, respectively. Further, other optional layers and their concrete embodiments are described in the above-mentioned publications.

Various anti-fogging agents and photographic stabilizers are employable for the light-sensitive material of the invention. Examples of them include azoles and azaindenes described in Research Disclosure No. 17643, pp. 24–25 (1978), nitrogen-containing carbonic acids and phosphoric acids described in Japanese Patent Provisional Publication No. 59(1984)-168442, mercapto compounds and their salts with metals described in Japanese Patent Provisional Publication No. 59(1984)-111636 and acetylene compounds described in Japanese Patent Provisional Publication No. 62(1987)-87957.

Various development terminators can be employable for the light-sensitive materials to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration to terminate the development. Concrete examples of a development terminator include an acid precursor which emits an acid by heating, an electrophilic compound which substitutes a chlorine atom existing together with by heating, a nitrogen-including heterocyclic compound, a mercapto compound and a precursor thereof.

An image-receiving material is generally used with the light-sensitive material of the invention.

The image-receiving material is described below.

The image-receiving material may comprise a support alone, but preferably an image-receiving layer is provided on the support.

A support of the image-receiving material is not particularly restricted, and materials for the above-described support of a light-sensitive material can be also employed. Examples of them include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

In the case where a porous material such as paper is used as a support of an image-receiving material, the surface of the material preferably has a certain smoothness.

An image-receiving layer of an image-receiving material comprises a white pigment, a binder and other additives. A white pigment itself or space among the white pigment grains accepts a polymerizable compound.

Examples of the white pigment employable for an image-receiving layer include inorganic white pigments such as oxides (e.g., silicon oxide, titanium oxide, zinc oxide, magnesium oxide and aluminum oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminum silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin and polyamide resin. The white pigment above-described can be used in the invention singly or in combination. A white pigment which can absorb a high amount of a polymerizable compound is preferably used.

As the binder, a water-soluble polymer, a polymer latex and a polymer soluble in an organic solvent are employed. Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrrolidone, polyacrylic acid, polymethacrylic acid, polyacrylamide, polyvinyl imidazole, polyvinyl pyrazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acrylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image-receiving layer.

A mean grain size of the white pigment is within a range of 0.1 to 20 μm, preferably 0.1 to 10 μm. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

The image-receiving layer may further contain various components other than the white pigment and the binder.

For example, a color developer can be contained in the image-receiving layer in a color formation system in which a color former and the color developer are used. Examples of the color developer include phenols, organic acids and salts, and esters. Zinc salt of a salicylic acid derivative is preferred in the case where a leuco dye is used as a color image forming substance (color former). Zinc salt of 3,5-di-α-methylbenzylsalicylic acid is particularly preferred.

The color developer is preferably contained in the image-receiving layer in a coating amount of 0.1 to 50 g/m$^2$, and more preferably 0.5 to 20 g/m$^2$.

A thermoplastic compound may be contained in the image-receiving layer. In the case where the thermoplastic compound is contained in the image-receiving layer, the image-receiving layer itself is preferably composed of an agglomerate of fine particles of the thermoplastic compound (i.e., granular thermoplastic compound). The image-receiving layer having this constitution has such advantages that the formation of a transferred image can be readily done and that a glossy image can be obtained under heating after the image formation. There is no specific limitation on the thermoplastic compounds, and any known thermoplastic resins (plastics) and waxes can be employed.

The glass transition point of the thermoplastic resin or the melting point of the wax is preferably not higher than 200° C.

A photopolymerization initiator or a thermal polymerization initiator may be contained in the image-receiving layer. In the image forming method using the image-receiving material, the color image forming substance is transferred onto the image-receiving material together with the unpolymerized polymerizable compound. Therefore, the photopolymerization initiator or the thermal polymerization initiator can be incorporated into the image-receiving layer to cure the unpolymerized polymerizable compound smoothly.

Next, below described are the steps of the image forming method in which the light-sensitive material of the invention is used. The steps include: imagewise exposing the light-sensitive material; simultaneously or thereafter heating the material from the side of the support (the side on which the light-sensitive layer is not provided); superposing and pressing a light-receiving material on the surface of the light-sensitive layer provided on the light-sensitive material.

Various exposure means can be employed in the imagewise exposure, and in general, the light-sensitive material is imagewise exposed to a radiation containing visible light to obtain a latent image of the silver halide. The kind of light source or the amount of radiation employed in the exposure can be selected depending on a light-sensitive wavelength (or intensified wavelength in the case of spectral sensitization) of the silver halide and a sensitivity of the light-sensitive material.

Examples of the radiation include natural light, ultraviolet light, visible light and infrared light. Examples of such low energy radiation light source include a fluorescent lamp, a tungsten lamp, a halogen lamp, a xenon flash lamp, various lasers (e.g., a gas laser, a solid laser, a chemical laser and a semiconductor laser), a light emission diode, a plasma emitting tube and FOT. A high energy radiation such as X-ray, γ-ray and electron beam is also available in special cases.

In the case where a full color image is formed, the light-sensitive material contains two or more microcapsules which are different from each other with respect to the spectral sensitivity. Accordingly, the light-sensitive material is exposed to two or more spectral lights to form a full color image.

The light source should be selected in consideration of the light-sensitive wavelength as is mentioned above. Further, it is preferably considered whether the image information is converted into an electrical signal or not (digital or analog). The processing speed of the system, the size of the image recording apparatus and the electric power of the apparatus are also important factors in the selection of the light source.

In the case where the image information is not converted into an electrical signal (for example, when a subject such as a landscape and a portrait is directly photographed, when an original image is directly copied, or when a positive such as a reversal film is exposed to light), exposure devices for a camera, a printer, an enlarging apparatus and a copying machine are available. A two-dimensional image can be exposed to light by one shot using this exposure device. Further, the image can also be scanned through a slit. An original image can be enlarged or reduced. In this case, a fluorescent lamp or a tungsten lamp is a preferred light source. However, a monochromatic light such as a laser is also available if two or more lights are used in combination.

In the case where the image information is an electrical signal, two or more monochromatic lights such as a light emission diode or a laser can be used in combination as a light source. The combination is determined in consideration of the spectral sensitivity of the heat developing color light-sensitive material. Further, various known display devices (CRT, liquid crystal display, electroluminescence display, electrochromic display and plasma display) are also available. In this case, the image information is an image signal such as a signal obtained by a video camera or an electron still camera, a television signal (e.g., a signal regulated by Japan Television Signal Standards (NTSC)), a signal consisting of many image elements obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The light sources may be the same or different. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available.

A light emitting tube or element can be used in a scanning exposure with respect to individual colors. Arrays such as a LED array, a liquid crystal shutter array and a magneto-optical element shutter array can be used to increase the speed of the exposure.

The display devices such as CRT include a monochromatic device and a color device. If a multiple exposure is carried out using some filters, even a monochromatic device can form a color image. Such system is also available.

A conventional two-dimensional display device can be used as a one-dimensional device such as FOT. In the case where the display device and a scanner are used in combination, the displayed image can be divided into two or more parts.

In the above-mentioned imagewise exposure process, a latent image is formed in the silver halide contained in microcapsules.

Simultaneously or after the imagewise exposure process, a heating process to develop the image is carried out in the image forming method in which the light-sensitive material of the invention is used.

It is difficult for conventional methods to shorten the development process. Therefore the light-sensitive material of the invention is heated from the side of the support (the side on which the light° sensitive layer is not provided).

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material may be heated by a heater which is larger than the light-sensitive material. The light-sensitive material may also be heated by scanning the material with a small heater (e.g., hot plate, heat roller, heat drum).

Further, the light-sensitive material can be heated although the material is not in contact with a heater. For example, the light-sensitive material may be heated with an electromagnetic wave, an infrared ray or a hot air.

In the present invention, the light-sensitive material is heated from the side of the support (the side on which the light-sensitive layer is not provided). The side of the light-sensitive layer is usually open to the air. However, the side of the layer may be covered with an adiabatic material to maintain the heating temperature. In this case, it is necessary to handle carefully the adiabatic material. If the adiabatic material is pressed on the light-sensitive material at a high pressure (10 kg/cm$^2$ or more), the microcapsules contained in the light-sensitive layer tend to be ruptured.

After the light-sensitive material is imagewise exposed to light, the light-sensitive material is heated preferably at an interval of 0.1 second or more. The heating temperature usually ranges from 60° C. to 260° C., preferably from 80° C. to 180° C. The heating time is in the range of 0.1 to 5 seconds.

A color image can be obtained on an image-receiving material by pressing the light-sensitive material on the image-receiving material to transfer the unpolymerized polymerizable compound to the image-receiving material.

For applying a pressure to the light-sensitive material and the image-receiving material, any known pressing methods can be employed.

For example, the light-sensitive material and the image-receiving material may be sandwiched between press plates such as a presser or they may be transferred using a pressure roller such as a nip roll to apply a pressure to them. A dot-impact device can be also employed to give intermittently a pressure to them.

Otherwise, a pressure may be applied to the light-sensitive material and the image-receiving material by spraying a high-pressure air by means of an air gun or using an ultrasonic wave-generating device or a piezoelectric element.

The light-sensitive material and the image-receiving material are preferably pressed at a pressure of not less than 500 kg/cm$^2$, and preferably not less than 800 kg/cm$^2$.

In the case where the core material of the microcapsules is solid or waxes at room temperature, the materials are pressed while heating or after heating. In this case, the temperature is within the range of 15°–120° C., preferably 30°–100° C. The speed of pressing and image-transferring is preferably within the range of 10–100 mm/sec.

The image forming method of the invention can be used for color photography, printing and copy (e.g., computer-graphic hard copy and xerox copy). The present invention provides a compact and inexpensive image forming system such as a copying machine and a printer.

COMPARISON EXAMPLE 1

Preparation of silver halide emulsion

To distilled water was added 24 g of lime-treated inert gelatin, and dissolved at 40° C. over 1 hour. To the resulting solution was added 3 g of NaCl, and then the pH value was adjusted to 3.2 using 1N-sulfuric acid.

To the obtained gelatin solution, the following Liquids I and II were added simultaneously at the same feed rate at the constant pAg value of 8.5 at 60° C. over 45 minutes according to the control double jet method. After that, the pH value was adjusted to 6.0 using 1N NaOH and then 4.8 g of the following compound (ATR-1) and 480 mg of the following compound (SB-1) were added. After 20 minutes, to the resulting mixture was further added 100 ml of an aqueous solution containing 4.1 g of KI at the same feed rate over 3 minutes. To the resulting emulsion was then added 1.1 g of the following compound (CK-1) to form sediment. After the emulsion was washed with water for desalting, 6.0 g of lime-treated gelatin was added and dissolved in the emulsion. Then, to the emulsion was further added 3 cc of 72% of aqueous solution of the following compound (ATR-1) so that the pH value might be adjusted to 6.2. Thus, a mono-dispersed tetradecahedral silver iodobromide emulsion (EB-1) (yield: 550 g, mean grain size: 0.24 μm, distribution coefficient: 20%) was prepared.

| Liquid I: | AgNO₃ | 120 g |
| | distilled water | 550 cc |
| Liquid II: | KBr | 85 g |
| | distilled water | 550 cc |

Preparation of silver halide emulsion (EG-1)

The procedure of the preparation of silver halide emulsion (EB-1) was repeated except that Liquids I and II were added over 15 minutes and that 450 mg of the following compound (SG-1) was added instead of the compound (SB-1). Thus, a monodispersed silver iodobromide emulsion (EG-1) (yield: 550 g, mean grain size: 0.18 μm, distribution coefficient: 22%) was prepared.

Preparation of silver halide emulsion (ER-1)

The procedure of the preparation of silver halide emulsion (EG-1) was repeated except that 450 mg of the following compound (SR-1) and 100 mg of the following compound (SR-3) were added instead of the compound (SG-1).

Thus, a monodispersed silver iodobromide emulsion (ER-1) (yield: 550 g, mean grain size: 0.18 μm, distribution coefficient: 22%) was prepared.

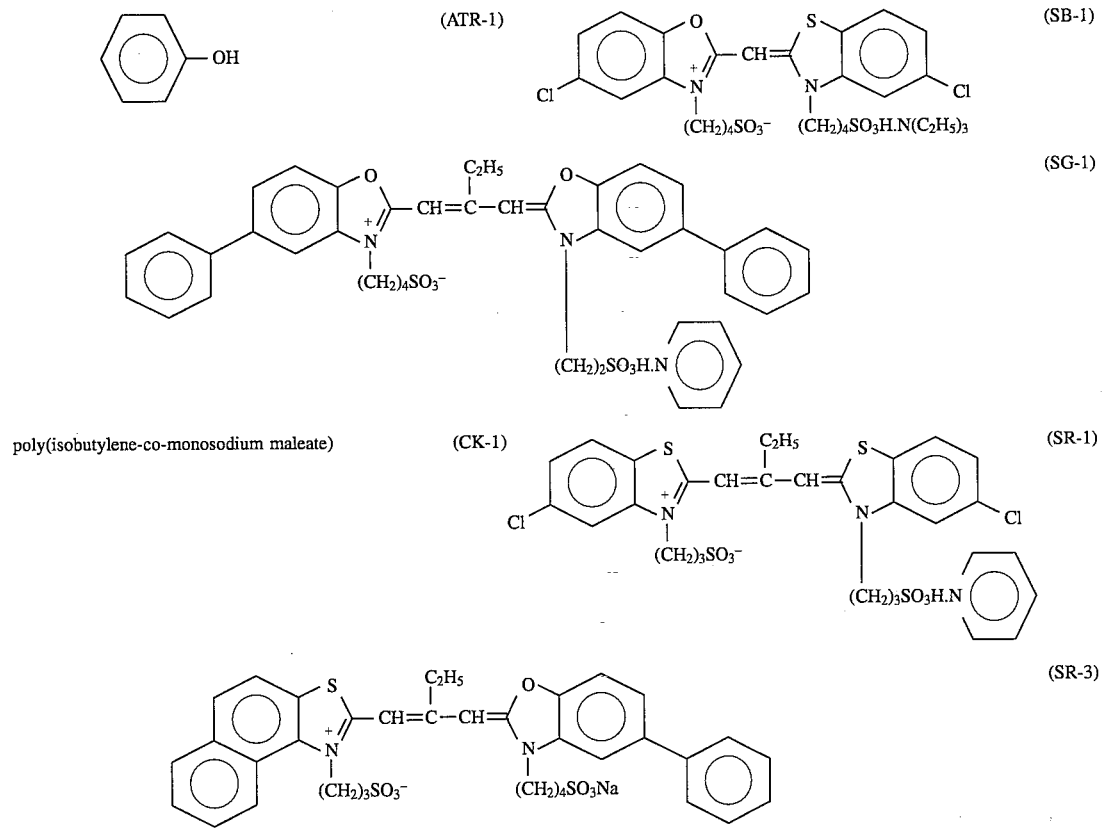

Preparation of solid dispersion (KB-1).

Into a 300 ml dispersion container were added 110 g of 5.4% aqueous solution of lime-treated gelatin, 20 g of 5% aqueous solution of polyethylene glycol (average molecular weight: 2,000), 70 g of the base precursor (BG-1) and 200 ml of glass beads of which diameters were within a range of 0.5–0.75 mm. The resulting mixture was stirred at 3,000 r.p.m. for 30 minutes using a Dynomill, and then the pH value was adjusted to 6.5 using 2N sulfuric acid to obtain a solid dispersion (KB-1) of the base precursor (BG-1) of which grain size was not more than 1.0 μm.

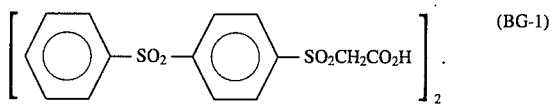

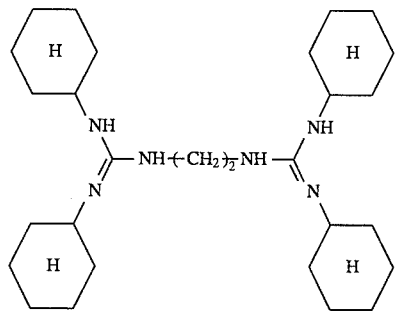

Preparation of pigment dispersion (GY-1)

To 255 g of the polymerizable compound (MN-2) was added 45 g of Microlith Yellow 4GA (tradename, available from Ciba-Geigy). The resulting mixture was stirred at 5,000 r.p.m. for 1 hour using Eiger Motor Mill (tradename of Eiger Engineering) to obtain a pigment dispersion (GY-1).

Preparation of pigment dispersion (GM-1)

In 255 g of the polymerizable compound (MN-2) were added 45 g of Microlith Red 3RA (tradename, available from Ciba-Geigy) and 4.5 g of Solsperse 24000 (tradename of ICI). The mixture was stirred at 5,000 r.p.m. using Eiger Motor Mill (tradename of Eiger Engineering) for 1 hour to obtain a pigment dispersion (GM-1).

Preparation of pigment dispersion (GC-1)

In 255 g of the polymerizable compound (MN-1) were added 45 g of copper phthalocyanine (C.I. Pigment 15), 1.13 g of Solsperse 5000 (tradename of ICI) and 3.37 g of Solsperse 24000 (tradename of ICI). The mixture was stirred at 5,000 r.p.m. using Eiger Motor Mill (tradename of Eiger Engineering) for 1 hour to obtain a pigment dispersion (GC-1).

Preparation of light-sensitive composition (PB-1)

To 45 g of the pigment dispersion (GY-1) were dissolved 9 g of 20 wt. % solution of copolymer (1P-1) in (SV-1), 2.3 g of (RD-1), 6.2 g of (RD-2), 1.0 g of 0.5 wt. % solution of (AT-1) in (SV-1) and 5.0 g of (ST-1).

To the resulting oily solution, 3.8 g of the silver halide emulsion (EB-1) and 24 g of the solid dispersion (KB-1) were added, and the resulting mixture was stirred at 10,000 r.p.m. for 5 minutes at 60° C. using a dissolver of 40 φ to obtain a light-sensitive composition (PB-1) in the form of a W/O emulsion.

Preparation of light-sensitive composition (PG-1).

To 45 g of the pigment dispersion (GM-1) were dissolved 9 g of 20 wt. % solution of copolymer (1P-1) in (SV-1), 2.3 g of (RD-1), 3.1 g of (RD-2), 1.0 g of 0.5 wt. % solution of (AT-1) in (SV-1) and 5.0 g of (ST-1).

To the resulting oily solution, 3.8 g of the silver halide emulsion (EG-1) and 24 g of the solid dispersion (KB-1) were added, and the resulting mixture was stirred at 10,000 r.p.m. for 5 minutes at 60° C. using a dissolver of 40 φ to obtain a light-sensitive composition (PG-1) in the form of a W/O emulsion.

Preparation of light-sensitive composition (PR-1).

To 45 g of the pigment dispersion (GC-1) were dissolved 9 g of 20 wt. % solution of copolymer (1P-1) in (SV-1), 2.3 g of (RD-1), 6.2 g of (RD-2), 1.0 g of 0.5 wt. % solution of (AT-1) in (SV-1) and 5.0 g of (ST-1).

To the resulting oily solution, 3.8 g of the silver halide emulsion (ER-1) and 24 g of the solid dispersion (K/B-1) were added, and the resulting mixture was stirred at 10,000 r.p.m. for 5 minutes at 50° C. using a dissolver of 40 φ to obtain a light-sensitive composition (PR-1) in the form of a W/O emulsion.

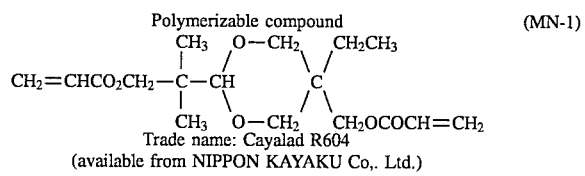

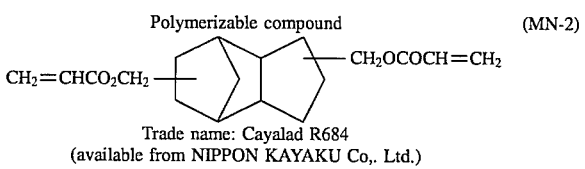

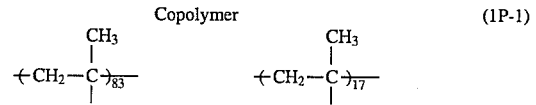

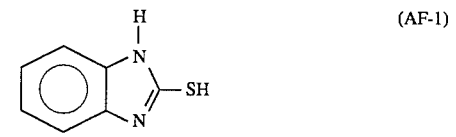

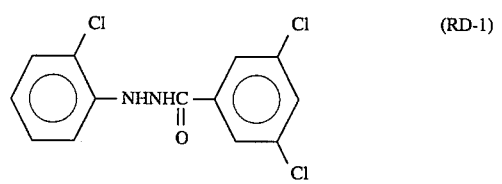

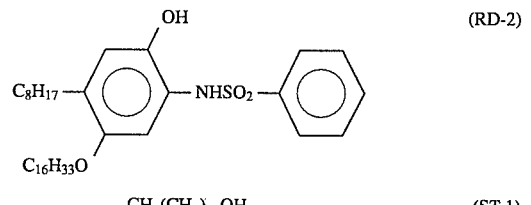

$CH_3(CH_2)_{16}OH$      (ST-1)

Preparation of microcapsule dispersion (CB-1)

To 4.0 g of 15% aqueous solution of the following polymer (2P-1) was added 36 g of distilled water, and then the pH value was adjusted to 5.0 using 2N sulfuric acid. To the resulting mixture was added 60 g of 10% aqueous solution of the following polymer (2P-2) and the obtained mixture was stirred at 60° C. for 30 minutes. Then the above-mentioned light-sensitive composition (PB-1) was added to the mixture and the resulting mixture was stirred at 7,000 r.p.m. for 20 minutes at 60° C. using a dissolver of 40 φ to obtain a W/O/W emulsion.

Independently, to 31.5 g of melamine were added 52.2 g of 37% aqueous solution of formaldehyde and 170.3 g of distilled water, and the resulting mixture was stirred at 60° C. for 30 minutes to obtain a transparent melamine-formaldehyde precondensate.

To 148 g of the above-prepared W/O/W emulsion was added 25 g of the above-prepared precondensate having been cooled to 25° C. While the resulting mixture was stirred at 1,200 r.p.m. using a propeller mixer, the pH value was adjusted to 5.0 using 2N sulfuric acid. The mixture was then gradually heated so that the temperature might be 70° C. after heating for 30 minutes, and then further stirred for 30 minutes. Further, to the mixture was added 10.3 g of 40% aqueous solution of urea, and the mixture was adjusted to pH 3.5 using 2N sulfuric acid, and then stirred at 70° C. for 40 minutes. Then the mixture was cooled to 25° C., and adjusted to pH 6.5 using 2N aqueous solution of sodium hydroxide. Thus, a light-sensitive microcapsule dispersion (CB-1) containing microcapsules having a melamine-formaldehyde resin shell was prepared.

Preparation of microcapsule dispersion (CG-1)

To 4.0 g of 15% aqueous solution of the following polymer (2P-1) was added 26 g of distilled water, and then the pH value was adjusted to 5.0 using 2N sulfuric acid. To the resulting mixture was added 70 g of 10% aqueous solution of the following polymer (2P-2) and the obtained mixture was stirred at 60° C. for 30 minutes. Then the above-mentioned light-sensitive composition (PG-1) was added to the mixture and the resulting mixture was stirred at 5,000 r.p.m. for 20minutes at 60° C. by means of a dissolver of 40 φ to obtain a W/O/W emulsion.

Then the procedure of the preparation of (CB-1) was repeated except for using 146 g of the above-prepared W/O/W emulsion to prepare a light-sensitive microcapsule dispersion (CG-1).

Preparation of microcapsule dispersion (CR-1)

To 4.0 g of 15% aqueous solution of the following polymer (2P-1) was added 36 g of distilled water, and then the pH value was adjusted to 5.0 using 2N sulfuric acid. To the resulting mixture was added 60 g of 10% aqueous solution of the following polymer (2P-2) and the obtained mixture was stirred at 60° C. for 30 minutes. Then the above-mentioned light-sensitive composition (PR-1) was added to the mixture and the resulting mixture was stirred at 5,000 r.p.m. for 20 minutes at 50° C. by means of a dissolver of 40 φ to obtain a W/O/W emulsion.

Then the procedure of the preparation of (CB-1) was repeated except for using the above-prepared W/O/W emulsion to prepare a light-sensitive microcapsule dispersion (CR-1).

Polymer (2P-1)
Potassium polyvinylbenzenesulfinate
Polymer (2P-2)
Polyvinyl pyrrolidone K-90

Preparation of light-sensitive material 101

With 66 cc of 5% aqueous solution of the following surface active agent (WW-1) were mixed 81 cc of 1% aqueous solution of the following surface active agent (WW-2) and 156 g of 10% aqueous solution of carboxyl modified polyvinyl alcohol (tradename: PVAKL 318, available from Kuraray Co., Ltd.) to prepare a surface active agent/binder liquid.

Independently, 15 g of the light-sensitive microcapsule dispersion (CB-1), 15 g of the light-sensitive microcapsule dispersion (CG-1) and 15 g of the light-sensitive microcapsule dispersion (CR-1) were mixed at 40° C. To the resulting mixture of the light-sensitive microcapsule dispersions was added 32 g of the above-prepared surface active agent/binder liquid. The resulting solution was stirred well at 40° C., and then 9 cc of 3% aqueous solution of a waterproofing agent for PVA (tradename: FL71, available from Toho Chemical Co., Ltd.) was added. The resulting mixture was stirred at 40° C. for 30 minutes to prepare a coating solution.

With 88 cc/m² of the prepared coating solution, a thin aluminum layer deposited on a polyethylene terephthalate film (thickness: 25 μm) was coated according to the extrusion method. Then the coated layer of the solution was dried at 60° C. The dried coated film was rolled up under the conditions of 25° C. and 65% so that the coated surface might be inside. Thus, a light-sensitive material (101) as a comparison example was prepared. The obtained light-sensitive material (101) was stored under the conditions of 25° C. and 55% in a sealed aluminum laminated bag.

Surface active agent (WW-1)

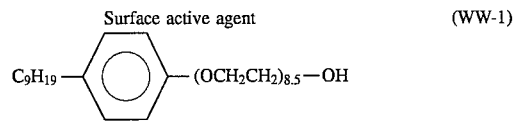

Surface active agent (WW-2)

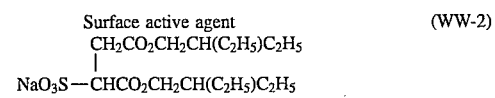

EXAMPLE 1

The procedure of Comparison Example 1 was repeated except that a compound which can homogeneously produce a polymerization inhibiting compound in the development process was added according to Table 1 to prepare each of light-sensitive compositions PB-1, PG-1 and PR-1. Thus, the light-sensitive materials of the invention (201)-(901) were prepared.

TABLE 1

| Material | PB | PG | PR |
|---|---|---|---|
| 201 | (1) 0.03 | (3) 0.3 | (9) 0.003 |
| 301 | (2) 0.01 | (6) 0.02 | (13) 0.008 |
| 401 | (7) 0.1 | (8) 0.005 | (11) 0.2 |
| 501 | (18) 0.06 | (18) 0.25 | (18) 0.08 |
| 601 | (14) 0.001 | (22) 0.04 | (23) 0.03 |
| 701 | (25) 0.1 | (26) 0.001 | (32) 0.05 |
| 801 | (12) 0.1 | (18) 0.02 | (31) 0.33 |
| 901 | (32) 0.10 | (21) 0.18 | (3) 0.12 |

In Table 1, each of the values in parenthesis means the PIR compound and each of the values outside parenthesis means the amount of the PIR compound (in gram).

Preparation of image-receiving material (RS-1)

A mixture of 240 g of calcium carbonate (tradename: PC700, available from Shiraishi Industrial Co., Ltd.), 5.6 g of the following surface active agent (poize 520, available from Kao Co., Ltd.) and 354.4 g of water was stirred at 8,000 r.p.m. for 3 minutes using a dispersing device (tradename: Ultra Disperser LK-41, Yamato Science Co., Ltd.). To 52 g of the resulting dispersion was added 52 g of 10% aqueous solution of polyvinyl alcohol (tradename: PVA-117, available from Kuraray Co., Ltd.), and then 4 ml of 1% aqueous solution of the following surface active agent and 22 ml of water were further added. Thus a coating solution for an image-receiving layer was prepared.

Surface active agent

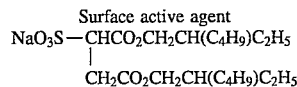

The coating solution was uniformly applied onto a paper having a basis weight of 80 g/m² (i.e., a paper having a fiber length distribution [defined by JIS-P-8207] in which the sum of weight percent of 24 mesh residue and 42 mesh residue is within a range of 30–60%, as described in Japanese Patent Provisional Publication No. 63(1988)-186239) in an amount of 65 g/m², and the coated layer of the solution was dried at 60° C. to prepare an image-receiving material (RS-1).

Image Formation and evaluation thereof

The following experiments were carried out under the conditions of 25° C. and 50%. The light-sensitive material (101) taken out from the sealed bag was exposed to light at color temperature of 3,100° K. using a halogen lamp through filters of: a step wedge in which the transmission density is changed from 0 to 4.0, ND filter in which the transmission density is 1.0 and CC filters of yellow and magenta (available from Fuji Photo Film Co., Ltd.) so that the gray balance might be adjusted.

The exposed light-sensitive material (101) was then heated from the side of the support at 150° C. and 155° C. for 2 seconds by means of a thermal developer having an exhaust device.

After 10 seconds, the light-sensitive material was superposed on the image-receiving material (RS-1) so that the coated layers of both materials might be in contact with each other, and they were passed through a pressure roller (diameter: 3 cm) having a pressure of 1,200 kg/cm² at the rate of 2 cm/sec.

The light-sensitive material was then removed from the image-receiving material to form a clear positive image on the image-receiving material.

With respect to the positive image formed on each image-receiving material at 150° C., the maximum density ($D_{max}(150)$) and the half of the maximum density ($D'(150)$) of each color were measured. Then, the density of the image which was obtained by the light-sensitive material exposed to the same amount of light that D'(150) had been given by and which was formed on each image-receiving material at 155° C. was measured (D'(155)). The RT values were calculated according to the following formula (1).

$$RT = \frac{D'(150) - D'(155)}{D_{max}(150)} \quad \text{Formula (1)}$$

As is evident from the definition of the formula (1), the less RT value the material exhibits, the less the image quality of the material depends on the temperature of the process of development treatment. The results are set forth in Table 2.

TABLE 2

| Material | Yellow | Magenta | Cyan |
|----------|--------|---------|------|
| 101 | 0.3 | 0.25 | 0.25 |
| 201 | 0.1 | 0.05 | 0.07 |
| 301 | 0.2 | 0.11 | 0.10 |
| 401 | 0.05 | 0.10 | 0.09 |
| 501 | 0.11 | 0.09 | 0.10 |
| 601 | 0.09 | 0.13 | 0.12 |
| 701 | 0.06 | 0.15 | 0.12 |
| 801 | 0.12 | 0.09 | 0.13 |
| 901 | 0.09 | 0.15 | 0.11 |

As is evident from Examples and Comparison Example, the density of the image obtained by the light-sensitive material of the invention varies little with the variation of the temperature of development treatment. In other words, the light-sensitive material of the invention always provides an image of good quality even if the temperature of development treatment varies. Further, the light-sensitive material of the invention provides an image of constant quality independently of the process of development treatment.

We claim:

1. An image forming method which comprises the steps of:

imagewise exposing to light a light-sensitive material which comprises a support and a light-sensitive layer provided thereon, said light-sensitive layer containing silver halide, a reducing agent, an ethylenically unsaturated polymerizable compound and a base precursor, wherein the light-sensitive material further contains a polymerization inhibitor releasing compound which has a function of releasing a polymerization inhibitor when the compound is reacted with a base; and simultaneously or thereafter heating the light-sensitive material, whereby a base is released from the base precursor, the light-sensitive layer is developed, the polymerizable compound is polmerized within the area where a latent image of the silver halide has been formed or where a latent image of the silver halide has not been formed, and a polymerization inhibitor is released from the polymerization inhibitor releasing compound over the entire area of the light-sensitive layer independent of the imagewise exposed area.

2. The image forming method as claimed in claim 1, wherein the silver halide, the reducing agent, the polymerizable compound, the base precursor and the polymerization inhibitor releasing compound are contained in microcapsules which are dispersed in the light-sensitive layer.

3. The image forming method as claimed in claim 1, wherein the heating of the light-sensitive material is at a temperature in the range of 60° to 260° C.

4. The image forming method as claimed in claim 1, wherein after heating the light-sensitive material, the light-sensitive material is pressed on an image-receiving material to transfer the unpolymerized polymerizable compound to an image-receiving material.

5. The image forming method as claimed in claim 1, wherein the polymerization inhibitor releasing compound has the formula (I):

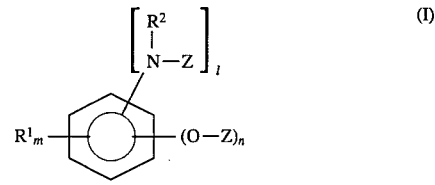

wherein Z is a group having a property of reacting with a base or a nucleophilic compound to break the bond of O—Z or N—Z; $R^1$ is hydrogen, an alkyl group, an alkyl group having one or more substituent groups selected from the group consisting of an aryl group, a halogen atom, an alkoxy group, an aryloxy group, an acyl group, hydroxyl and cyano, a cycloalkyl group, an aryl group, an aryl group having one or more substituent groups selected from the group consisting of an alkyl group, a halogen atom, an alkoxy group, an aryloxy group, an acyl group, hydroxyl and cyano, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an amino group having one or more substituent groups selected from the group consisting of an alkyl group, an aryl group, a halogen atom, an alkoxy group, an aryloxy group, an acyl group, hydroxyl and cyano, a sulfonylamino group, cyano, nitro, an alkylthio group, an arylthio group, a mercapto group, a sulfonyl group, sulfo, sulfamoyl or a halogen atom; $R^2$ is an alkyl group, a cycloalkyl group, an aralkyl group, an aryl group, an acyl group or hydrogen; "m" is an integer of 0 to 5; each of "l" and "n" independently is an integer of 0 to 4; and the sum of "l" and "n" is 1 or more.

6. The image forming method as claimed in claim 1, wherein the polymerization inhibitor releasing compound has the formula (II-1) or (II-2):

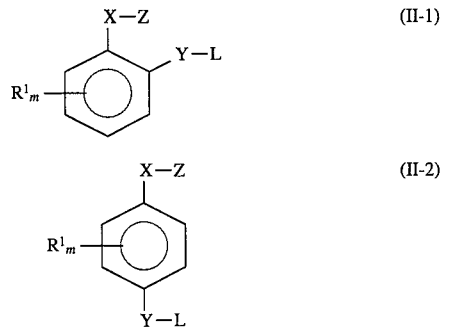

wherein Z is a group having a property of reacting with a base or a nucleophilic compound to break the bond of X—Z; each of X and Y independently is oxygen, sulfur or —$CR^6R^7$— wherein each of $R^6$ and $R^7$ independently is hydrogen, an alkyl group, an alkyl group having one or more substituent groups selected from the group consisting of an aryl group, a halogen atom, an alkoxy group, an aryloxy group, an acyl group, hydroxyl and cyano, an aryl group or an aryl group having one or more substituent groups selected from the group consisting of an alkyl group, a halogen atom, an alkoxy group, an aryloxy group, an acyl group, hydroxyl and cyano; L is an elimination group; $R^1$ is hydrogen, an alkyl group, an alkyl group having one or more substituent groups selected from the group consisting of an aryl group, a halogen atom, an alkoxy group, an aryloxy group, an acyl group, hydroxyl and cyano, a cycloalkyl group, an aryl group, an aryl group having one or more substituent groups selected from the group consisting of an alkyl group, a halogen atom, an alkoxy group, an aryloxy group, an acyl group, hydroxyl and cyano, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an amino group having one or more substituent groups selected from the group consisting of an alkyl group, an aryl group, a halogen atom, an alkoxy group, an aryloxy group, an acyl group, hydroxyl and cyano, a sulfonylamino group, cyano, nitro, an alkylthio group, an arylthio group, a mercapto group, a sulfonyl group, sulfo, sulfamoyl or a halogen atom; and "m" is an integer of 0 to 4.

7. The image forming method as claimed in claim 1, wherein the polymerization inhibitor releasing compound has the formula (III-1) or (III-2):

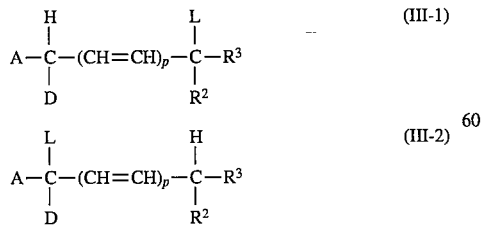

wherein L is an elimination group; A is an electron attractive group; D is hydrogen, an alkoxy group, an aryloxy group, an alkyl group, an alkyl group having one or more substituent groups selected from the group consisting of an aryl group, a halogen atom an alkoxy group, an aryloxy group, an acyl group, hydroxyl and cyano, an aryl group, an aryl group having one or more substituent groups selected from the group consisting of an alkyl group, a halogen atom, an alkoxy group, an aryloxy group, an acyl group, hydroxyl and cyano, a cycloalkyl group, an alkylthio group, an arylthio group, amino, an amino group having one or more substituent groups selected from the group consisting of an alkyl group, an aryl group, halogen atom, an alkoxy group, an aryloxy group, an acyl group, hydroxyl and cyano or a halogen atom; each of $R^2$ and $R^3$ independently is an alkyl group, an alkyl group having one or more substituent groups selected from the group consisting of an aryl group, a halogen atom, an alkoxy group, an aryloxy group, an acyl group, hydroxyl and cyano, a cycloalkyl group, an aryl group, an aryl group having one or more substituent groups selected from the group consisting of an alkyl group, a halogen atom, an alkoxy group, an aryloxy group, an acyl group, hydroxyl and cyano, an acyl group or hydrogen; and "p" is an integer of 0 to 3.

8. The image forming method as claimed in claim 1, wherein the polymerization inhibitor releasing compound has the formula (IV):

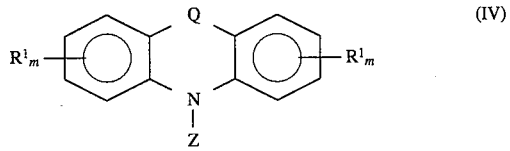

wherein $R^1$ is hydrogen, an alkyl group, an alkyl group having one or more substituent groups selected from the group consisting of an aryl group, a halogen atom, an alkoxy group, an aryloxy group, an acyl group, hydroxyl and cyano, a cycloalkyl group, an aryl group, an aryl group having one or more substituent groups selected from the group consisting of an alkyl group, a halogen atom, an alkoxy group, an aryloxy group, an acyl group, hydroxyl and cyano, an alkenyl group, an alkynyl group, an alkoxy group, an aryloxy group, a heterocyclic group, an acyl group, carboxyl, carbamoyl, an alkoxycarbonyl group, an aryloxycarbonyl group, an acyloxy group, a sulfonyloxy group, amino, an amino group having one or more substituent groups selected from the group consisting of an alkyl group, a halogen atom, an alkoxy group, an aryloxy group, an acyl group, hydroxyl and cyano, a sulfonylamino group, cyano, nitro, an alkylthio group, an arylthio group, a mercapto group, a sulfonyl group, sulfo, sulfamoyl or a halogen atom; Q is oxygen, sulfur or —$CR^6R^7$— wherein each of $R^6$ and $R^7$ independently is hydrogen, an alkyl group, an alkyl group having one or more substituent groups selected from the group consisting of an aryl group, a halogen atom, an alkoxy group, an aryloxy group, an acyl group, hydroxyl and cyano, an aryl group or an aryl group having one or more substituent groups selected from the group consisting of an alkyl group, a halogen atom, an alkoxy group, an aryloxy group, an acyl group, hydroxyl and cyano; "m" is an integer of 0 to 4; and Z is a group having a property of reacting with a base or a nucleophilic compound to break the bond of N—Z.

9. The image forming method as claimed in claim 1, wherein the amount of the polymerization inhibitor releasing compound contained in the light-sensitive material is in the range of 0.001 to 50 wt. % based on the amount of the polymerizable compound.

* * * * *